US010965286B2

(12) United States Patent
Maier

(10) Patent No.: US 10,965,286 B2
(45) Date of Patent: Mar. 30, 2021

(54) REMOTE-CONTROL SYSTEM WITH HOMOPOLAR MAGNETS

(71) Applicant: Ferdinand Maier, Neumarkt am Wallersee (AT)

(72) Inventor: Ferdinand Maier, Neumarkt am Wallersee (AT)

(73) Assignee: fm marketing gmbh, Neumarkt am Wallersee (AT)

( * ) Notice: Subject to any disclaimer, the term of this patent is extended or adjusted under 35 U.S.C. 154(b) by 256 days.

(21) Appl. No.: 15/775,588

(22) PCT Filed: Nov. 10, 2016

(86) PCT No.: PCT/EP2016/077282
§ 371 (c)(1),
(2) Date: May 11, 2018

(87) PCT Pub. No.: WO2017/081161
PCT Pub. Date: May 18, 2017

(65) Prior Publication Data
US 2018/0337675 A1    Nov. 22, 2018

(30) Foreign Application Priority Data

Nov. 11, 2015  (DE) ...................... 10 2015 119 485.6

(51) Int. Cl.
*H03K 17/97*    (2006.01)
*G05G 1/02*    (2006.01)
(Continued)

(52) U.S. Cl.
CPC ............... *H03K 17/97* (2013.01); *G05G 1/02* (2013.01); *G05G 5/05* (2013.01); *H01H 36/0073* (2013.01); *G05G 9/047* (2013.01)

(58) Field of Classification Search
CPC .... H03K 17/97–17/972; H01H 36/00–36/004; H01H 36/0073; H01H 2036/0093; H01H 36/02
See application file for complete search history.

(56) References Cited

U.S. PATENT DOCUMENTS

2004/0183778 A1    9/2004  Endo
2012/0326817 A1    12/2012 Kayama et al.
2014/0015596 A1    1/2014  Martin et al.

FOREIGN PATENT DOCUMENTS

GB    2284672 A  *  6/1995  ............. H03K 17/97
GB    2284672 A      6/1995
JP    H0541037 U     6/1993

OTHER PUBLICATIONS

International Search Report, PCT/EP2016/077282, dated Jun. 16, 2017, 3 pages.
(Continued)

*Primary Examiner* — Ramon M Barrera
(74) *Attorney, Agent, or Firm* — Stinson LLP

(57) ABSTRACT

The invention relates to a remote-control system (1) comprising: a pushbutton (8) that can be pressed by a user for inputting information in that the user applies a pressure in a direction (18); a sensor magnet (23) arranged on the underside of the pushbutton (8), when viewed in the pressure application direction (18); and an armature magnet (27) arranged below the pushbutton (8), when viewed in the pressure application direction (18), and fixed relative to the pushbutton (8), wherein the magnetic poles (39, 41) of the sensor magnet (23) and of the armature magnet (27) are arranged in such a way that the pushbutton (8) is pressed by the sensor magnet (23) away from the armature magnet (27), against the pressure application direction (18).

16 Claims, 5 Drawing Sheets

(51) Int. Cl.
    *G05G 5/05*           (2006.01)
    *H01H 36/00*         (2006.01)
    *G05G 9/047*        (2006.01)

(56) References Cited

OTHER PUBLICATIONS

Written Opinion, PCT/EP2016/077282, dated Jun. 16, 2017, 4 pages.

\* cited by examiner

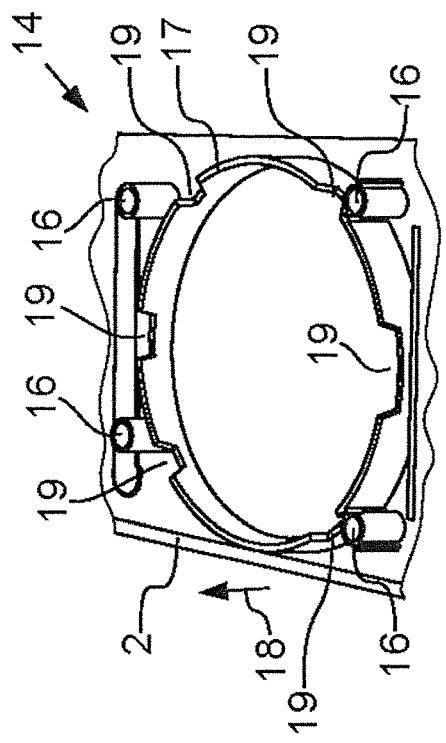
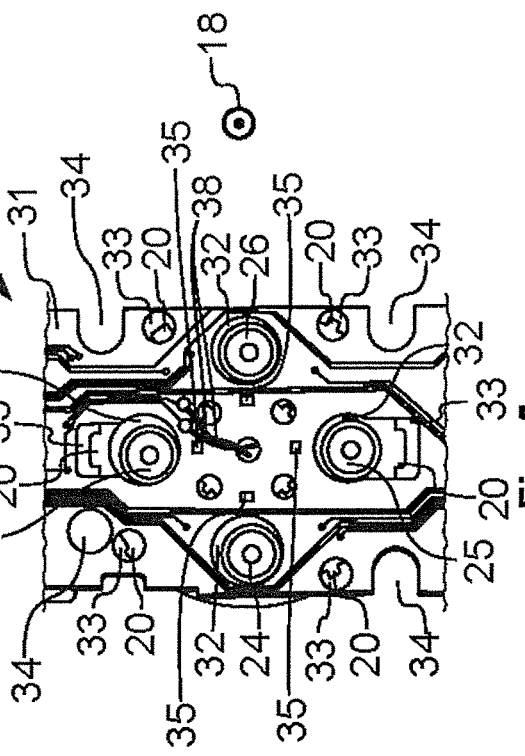
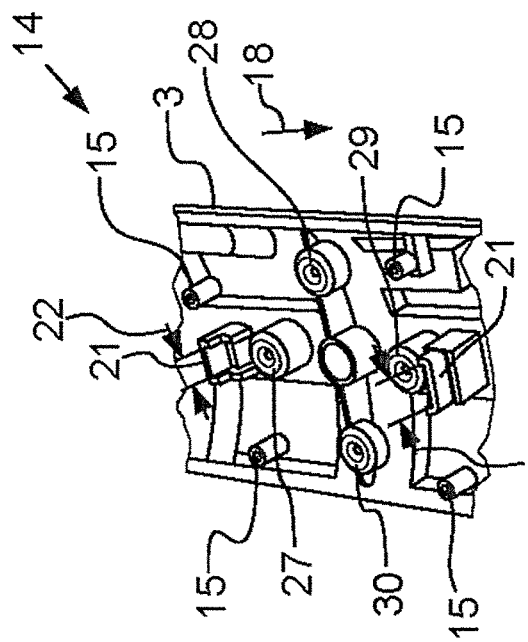
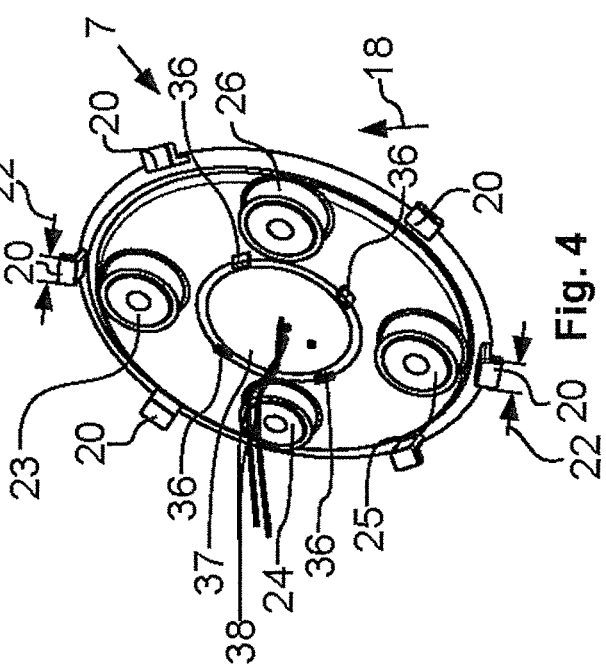

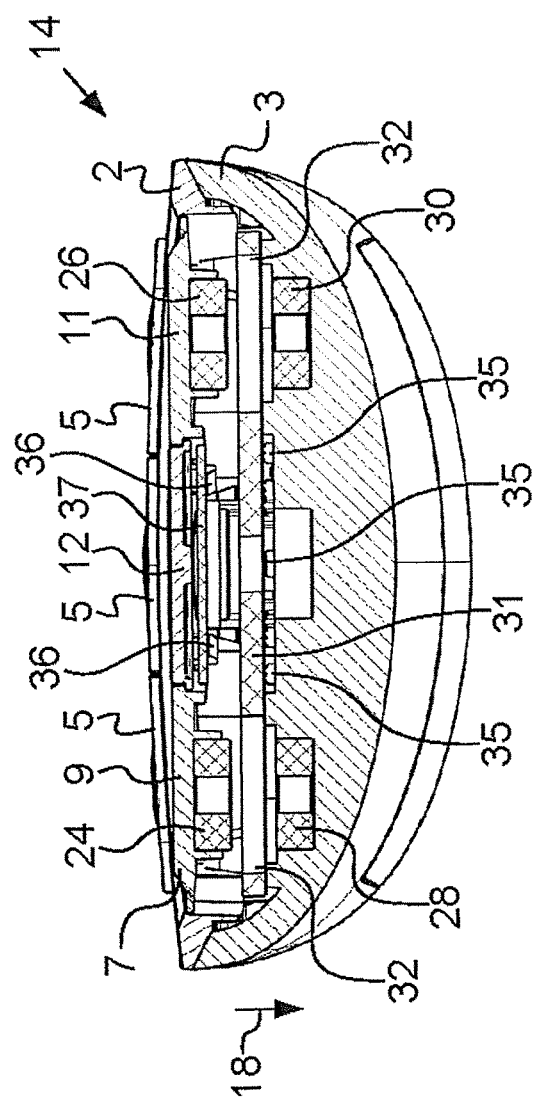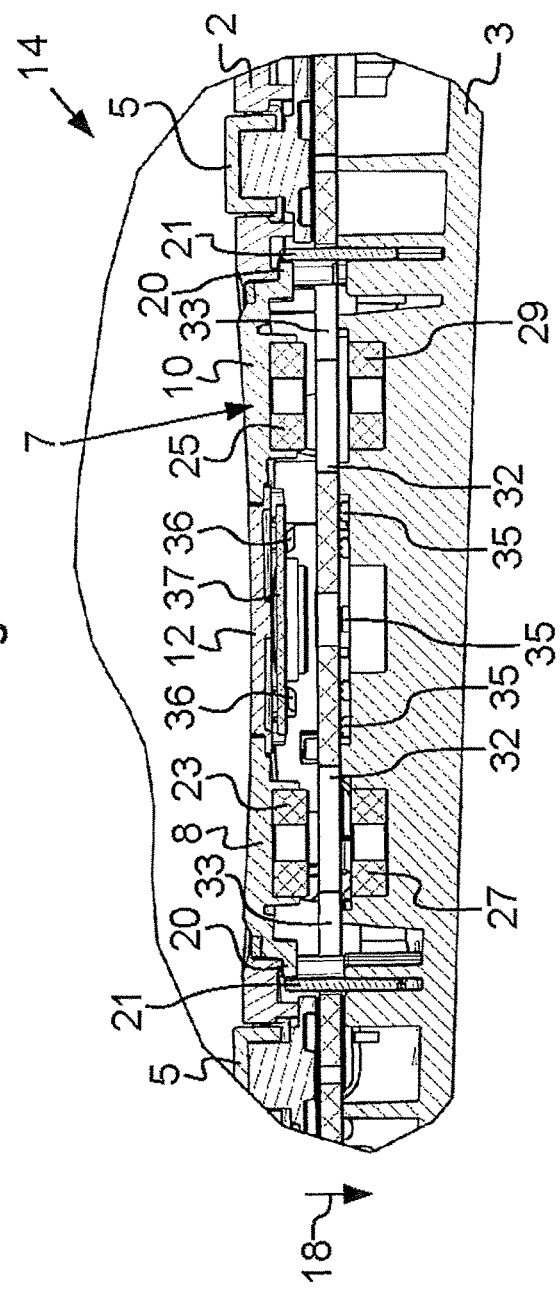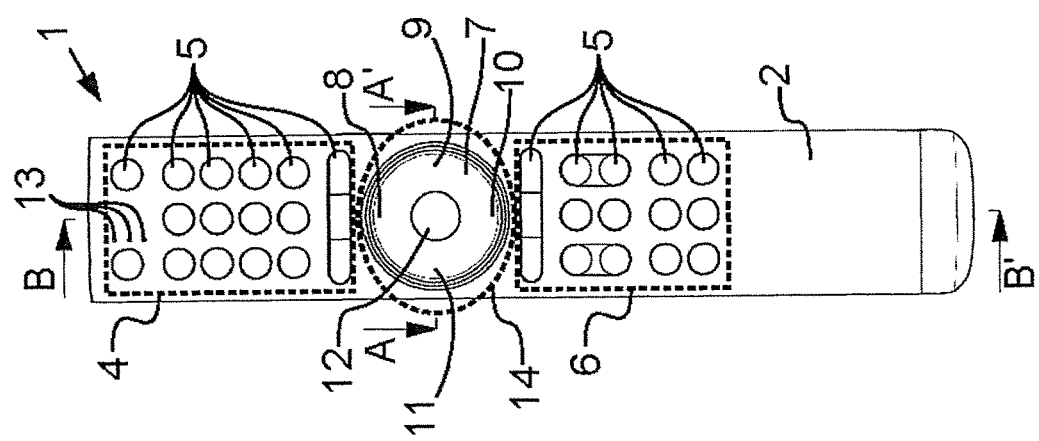

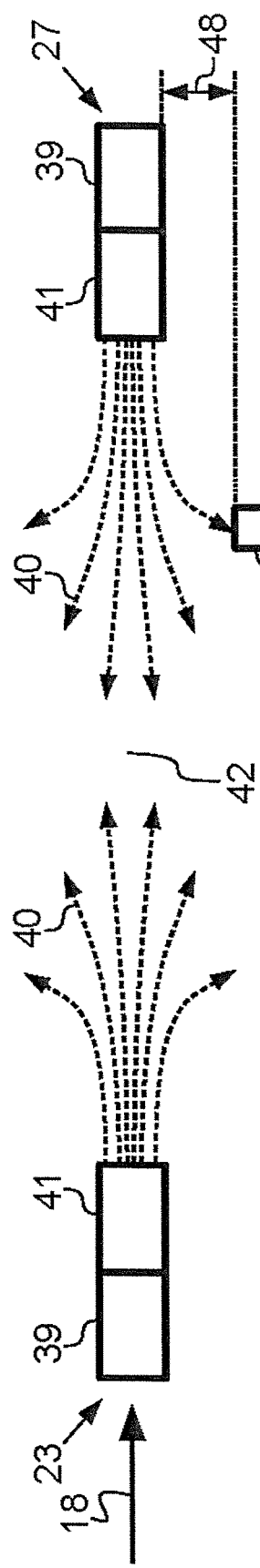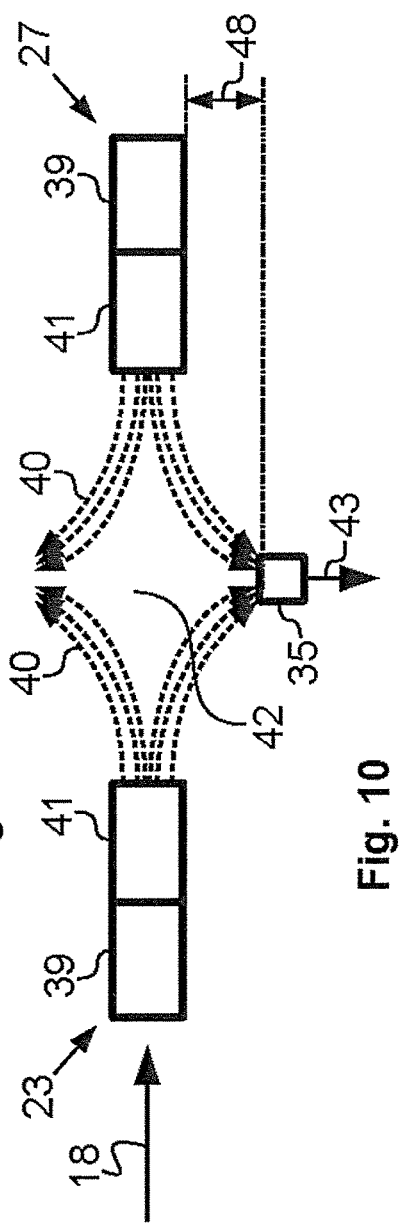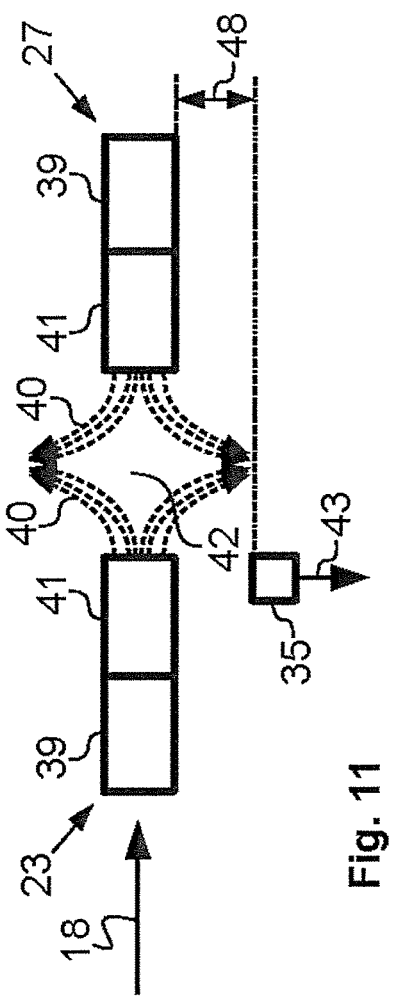

REMOTE-CONTROL SYSTEM WITH HOMOPOLAR MAGNETS

REFERENCE TO RELATED APPLICATIONS

The present invention relates to a remote-control system. This application is a U.S. national stage application of International Patent Application No. PCT/EP2016/077282, filed Nov. 10, 2016, and claims the benefit of priority of German Application No. 10 2015 119 485.6, filed Nov. 11, 2015, the entire disclosures of which are incorporated herein by reference.

FIELD OF THE INVENTION

The present invention relates to a remote-control system.

BACKGROUND

A remote-control system is known, for example, from WO 2010/119 348 A1. It comprises a pushbutton to input information in that the user applies a pressure in a pressure application direction; a spherical sensor magnet arranged on the underside of the pushbutton, when viewed in the pressure application direction; and a circular armature magnet fixed relative to the pushbutton on the housing. The magnetic poles of the spherical sensor magnet and the circular armature magnet are arranged as opposite poles. The user can press the pushbutton to input information in the pressure application direction, causing the spherical sensor magnet to be pushed out from an initial position in the centre of the circular armature magnet. The information to be input can now be entered on the basis of a change in the magnetic field in the pressure application direction beneath the sensor magnet. If the user releases the pressure on the pushbutton, the circular armature magnet resets the position of the spherical sensor magnet, and thus the pushbutton, by pulling it back into the initial position.

SUMMARY OF THE INVENTION

In accordance with one aspect of the invention, a remote-control system comprises a pushbutton that can be pressed by a user to input information in that the user applies a pressure in a pressure application direction; a sensor magnet arranged on the underside of the pushbutton when viewed in the pressure application direction; and an armature magnet arranged below the pushbutton when viewed in the pressure application direction, and fixed relative to the pushbutton, wherein the magnetic poles of the sensor magnet and of the armature magnet are arranged in such a way that the pushbutton is pressed with the sensor magnet away from the armature magnet, against the pressure application direction.

The said remote-control system is based on the idea that the reset effect in the abovementioned remote-control system is caused by the antipole arrangement of the spherical sensor magnet and the circular armature magnet. When viewed in the pressure application direction, such reset effect, however, is not effective over an arbitrarily large travel distance of the pushbutton, because if the spherical sensor magnet is pushed too far out of the circular armature magnet, both magnets will be arranged in homopolar position, and the circular armature magnet repels the spherical sensor magnet. This would lead to a loss of the reset effect. The travel distance could be extended by selecting bigger magnets, but then the assembly space would have to be increased in an unacceptable way. As remote-control systems are mass-produced goods, the costs for correspondingly bigger magnets would also increase in an unacceptable way.

Here, the said remote-control system offers a solution by arranging the armature magnet and the sensor magnet in a homopolar position from the beginning, and having them move towards each other homopolarly. This causes both magnets to constantly repel each other, thus avoiding a transition between an opposite and a homopolar arrangement of both magnets, thereby limiting the travel distance of the pushbutton only by the magnetic force of the two magnets and the weight force of the pushbutton including the sensor magnet. The arrangement of the abovementioned remote-control system, however, is also subject to this limitation.

An additional advantage of the said remote-control system is that the two magnets may be executed in any geometrical manner. Owing to the principles involved, one of the two magnets in the abovementioned remote-control system must encompass the other magnet which would only be possible with ring magnets or U-magnets.

In one embodiment, the said remote-control system comprises a measuring sensor arranged between the sensor magnet and the armature magnet when viewed in the pressure application direction to output a pushbutton position signal which depends on a magnetic sensor field energized by the sensor magnet, and a magnetic armature field energized by the armature magnet.

The arrangement of the measuring sensor between the two homopolarly arranged magnets allows not only detection of the pressing of the pushbutton itself as input information— i.e. pressed and not pressed. Intermediate states of the pressure of the pushbutton may also be recognized. In this way, for example, a control ring comprising several direction buttons may be executed on a remote control, allowing a cursor to be moved on a screen at different speeds depending on the depth of the pressure of the pushbutton.

In a particular embodiment of the said remote-control system, the measuring sensor is arranged at an angle to the armature magnet when viewed in the pressure application direction, and fixed at a distance from it. The embodiment is based on the idea that the sensor magnet, when arranged homopolarly to the armature magnet, condenses the magnetic field lines up to the maximum of the magnetic field distribution when moved towards to the armature magnet. If the two magnets are located very close to each other, this compaction is so high that the magnetic field lines run almost parallel, as inside an elongated coil. In this way, the magnetic field—compared with a stray field detection in an antipole alignment of the magnets—may be measured over a larger area of the field distribution by the measuring sensor, so that the increase of the magnetic field strength may be used over a larger travel distance of the pushbutton, and an accordingly higher sensitivity may be achieved when the measuring sensor detects the pushbutton position.

In a preferred embodiment of the said remote-control system, the measuring sensor is arranged at a distance to the armature magnet, and fixed at this point. In this way, the area of the field distribution which can be measured by the measuring sensor may be increased.

In a further embodiment of the said remote-control system, the measuring sensor is attached to a circuit board which is arranged in the housing in front of the armature magnet when viewed in the direction of movement. In this way, the electronic evaluation system for the input information may be positioned within close proximity to the measuring sensor.

In an additional embodiment of the said remote-control system, the circuit board has an immersion opening into which the sensor magnet may sink when the pushbutton is pressed. In this way, the two magnets can be brought closer to one another so that the field can be condensed to such an extent that the magnetic field distribution comes close to the theoretically conceivable maximum.

In an additional embodiment of the said remote-control system, the measuring sensor is arranged at a smaller distance to the armature magnet than to the sensor magnet when the sensor magnet is in initial position. In this way, the area of the magnetic field distribution, in which there is a high sensitivity of the measuring sensor, may be completely utilized.

In another embodiment, the said remote-control system comprises a housing with a guiding element to guide the pushbutton in the pressure application direction. The embodiment is based on the idea that the antipole arrangement of the magnets causes the magnets to repel each other, but their position to each other is unstable, however, because both magnets try to align in a homopolar direction. The guiding element may be used to stabilize the unstable position of both magnets to each other.

In an additional embodiment, the said remote-control system comprises a limiting element to limit a movement of the pushbutton in the guiding element against the pressure application direction. The limiting element may be used to select any initial position of the sensor magnet which does not require that the magnetic repulsion force of the two magnets and the weight force of the sensor magnet including the pushbutton are balanced.

In a particular embodiment of the said remote-control system, the limiting element is a spigot protruding at an angle from the pushbutton at an underside of the pushbutton when viewed in the pressure application direction. The spigot arranged on the underside of the pushbutton allows the pushbutton to be flush to the housing.

In a preferred embodiment of the said remote-control system, the spigot is guided in the guiding element. In this way, an anti-twist protection is also provided for the pushbutton to prevent the pushbutton from turning around its own axis in the housing when viewed in the pressure application direction.

In a particularly preferred embodiment of the said remote-control system, the abovementioned circuit board, on which the measuring sensor is arranged, comprises a recess, into which the spigot can be sunk in the pressure application direction. The recess prevents the spigot on the pushbutton touching the circuit board before the pushbutton is reached by the spigot and by the maximum possible lift of the pushbutton in the pressure application direction.

In an even further embodiment of the said remote-control system, the pushbutton is part of a switch, to which the sensor magnet is attached eccentrically to a centre axis, wherein starting from the centre axis opposite the sensor magnet, another sensor magnet is attached to the switch. Usually, a switch requires a pivot bearing, around which the switch can be turned. Such a pivot bearing, however, is obsolete with the said embodiment, because the switch is completely retained by the at least three magnets, wherein both pushbuttons may be pressed independently on the switch.

In an additional embodiment of the said remote-control system, the armature magnet is aligned in a line with the sensor magnet when viewed in the pressure application direction, wherein another armature magnet is fixed on the housing which is located in a line with the further sensor magnet when viewed in the pressure application direction. In this way, both armature magnets may be executed on a small geometric scale, which leads to savings in assembly space, weight and costs.

BRIEF DESCRIPTION OF THE DRAWINGS

The properties, features and benefits of the invention described above, as well as the manner in which they are achieved will be made clearer in connection with the following description of the embodiment examples, which are described in more detail in connection with the drawing. The following is shown:

FIG. 2 a part of the lower casing of the remote-control system of FIG. 1 in a perspective view;

FIG. 3 a part of the upper casing of the remote-control system of FIG. 1 in a perspective view;

FIG. 4 a control ring in the remote-control system of FIG. 1 in a perspective view;

FIG. 5 a part of a circuit board in the remote-control system of FIG. 1 with installed control ring of FIG. 4 in a view from below;

FIG. 6 the remote-control system of FIG. 1 in a plan view;

FIG. 7 a cross-sectional view through the remote-control system of FIG. 1 along the A-A' line of FIG. 6;

FIG. 8 a cross-sectional view through the remote-control system of FIG. 1 along the B-B' line of FIG. 6;

FIG. 9 a schematic representation of a sensor magnet in a first position relative to an armature magnet;

FIG. 10 a schematic representation of the sensor magnet in a second position relative to the armature magnet;

FIG. 11 a schematic representation of the sensor magnet in a third position relative to the armature magnet.

Figure 1:
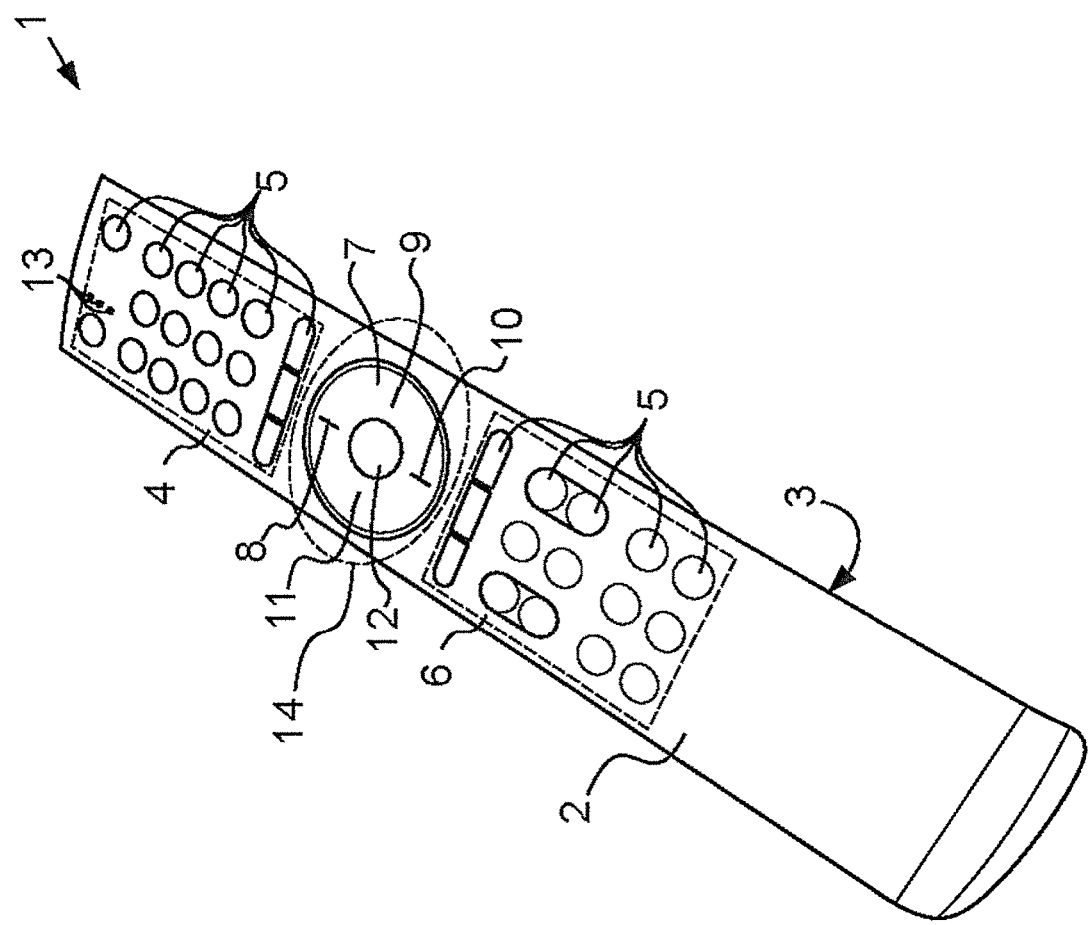
FIG. 1 a remote-control system in a perspective view.

In the figures, the same technical elements are provided with the same reference signs, and are only described once. The figures are purely schematic, and, in particular, do not reflect the actual geometric proportions. Reference is made to FIG. 1 showing a perspective view of a remote-control system 1.

DETAILED DESCRIPTION OF PREFERRED EMBODIMENTS

The remote-control system 1 comprises a housing comprising an upper casing 2 and a lower casing 3, as well as a first keypad 4 with a plurality of pushbuttons 5 and a second keypad 6 with a plurality of pushbuttons 5. For reasons of clarity, not all of the pushbuttons 5 in the keypads 4, 6 are marked with reference signs in the figures.

Both keypads 4 and 6 are separated from one another by a control ring 7 comprising a first pushbutton 8, a second pushbutton 9, a third pushbutton 10 and a fourth pushbutton 11. The four pushbuttons are intended to move a control element on a multi-media system which is not shown, and are thus arranged in the four possible directions of movement and at a distance of 90° around a confirmation button 12.

The remote-control system 1 may be provided with other display elements 13, such as small lights, which can be used to display the functional condition of the remote-control system 1 to the user of the remote-control system 1.

The invention is explained in more detail in the following by describing one area 14 of the remote-control system 1 in which the control ring 7 is located. However, this should not be taken as restrictive because the following ideas can basically be transferred to any pushbutton 5 in the keypads 4, 6.

The internal layout of the remote-control system 1 in this area 14 is described in more detail in the following using FIGS. 2 to 8.

In the area 14, the lower casing 3 comprises spigots 15, and the upper casing 2 comprises 2 sleeves 16 to connect the lower casing 3 with the upper casing 2 which can be executed and connected with each other similar to the manner, for example, known from EP 2 620 044 A1. Alternatively or additionally, the lower casing 3 and the upper casing 2 could also be glued, screwed or fixed permanently in any other way relative to each other.

The upper casing 2 is provided with a collar 17 to guide the control ring 7, in which the control ring 7 can be moved in and against the pressure application direction 18 of the pushbuttons 5, 8, 9, 10, 11. Several recesses 19 are arranged around the collar 17. Several spigots 20 protruding radially from the control ring 7 are arranged around, and when viewed in the pressure application direction 18, on the underside of the control ring 7. The recesses 19 and the spigots 20 are arranged in such a way that the control ring 7 can only be inserted into the collar 17 in certain rotational positions. In order to allow only a single rotational position for the control ring 7 in the collar 17, the recesses 19 and spigots 20 should have different circumferential distances to each other.

Alternatively to the collar 17 or additionally to the collar 17, guide rails 21 may be provided to guide the spigots 20 in the lower casing 3. For this purpose, the guide rails 21 may be made of a material on which the spigots 20 may slide with low friction, so that the guiding element of the spigots 20 is permanently resistant to abrasion. To ensure the abovementioned unique rotational position of the control ring 7, the spigots 20 and the guide rails 21 may be made of different widths 22.

When viewed in the pressure application direction 18, a first sensor magnet 23 is arranged underneath the first pushbutton 8, a second sensor magnet 24 is arranged underneath the second pushbutton 9, a third sensor magnet 25 is arranged underneath the third pushbutton 10, and a fourth sensor magnet 26 is arranged underneath the fourth pushbutton 11 on the control ring 7. These sensor magnets 23 to 26 are moved accordingly when the pushbuttons 8 to 11 are pressed on the control ring 7 in the pressure application direction. Additionally, a first armature magnet 27, a second armature magnet 28, a third armature magnet 29, and a fourth armature magnet 30 are fixed on the lower casing 3. The armature magnets 27 to 30 are arranged in such a manner that after inserting the control ring 7 into the collar 17, and assembling the upper casing 2 and the lower casing 3, the first armature magnet 27 is positioned underneath the first sensor magnet 23 and covered by it, the second armature magnet 28 is positioned underneath the second sensor magnet 24 and covered by it, the third armature magnet 29 is positioned underneath the third sensor magnet 25 and covered by it, and the fourth armature magnet 28 is positioned underneath the fourth sensor magnet 26 and covered by it.

When viewed in the pressure application direction 18, a circuit board 31 is installed between the sensor magnets 23 to 26 and the armature magnets 27 to 30 when assembling the upper casing 2 and the lower casing 3, providing immersion openings 32 for the sensor magnets 23 to 26 and recesses 33 for the spigots 20. Some of the immersion openings 32 and the recesses 33 may also be executed as single pieces as shown in FIG. 5. In addition, the circuit board 31 may also be provided with holes 34 for the spigots 15 and sleeves 16.

Measuring sensors 35 are arranged on the underside of the circuit board 31 at a distance to the immersion openings 32 when viewed in the pressure application direction 18, which detect the magnetic field of the magnets 23 to 26 and 27 to 30, and transfer it to an evaluation circuit on the circuit board 31 by means of a pushbutton position signal 43 as shown in FIGS. 9 to 11. The measuring sensors 35 may be based on any physical principles, such as, for example, magnetoresistive, Hall effect, magnetostrictive or oscillatory. No specific physical measuring principle is required.

Finally, another circuit board 37 is held in the centre of the control ring 7 by means of snap-fits 36, on which an electronic circuit for detecting any activation of the confirmation button 12 is executed. The detected activation is transferred to the circuit board 31 via wires 38. Further gaps are executed for the wires 38 and the snap-fits 36, to which no reference signs are allocated in FIG. 5 for reasons of clarity. The snap-fits 36 are also represented in FIG. 5 without reference signs for reasons of clarity. In addition, further electronic components are arranged on the circuit board 31 which are also not marked with reference signs for reasons of clarity.

FIGS. 9 to 11 are used in the following to describe the detection of the pressure of the pushbutton of one of the pushbuttons 8 to 11 on the control ring 7 by means of measuring sensors 35.

All magnets 23 to 26 and 27 to 30 in the remote-control system 1 are provided with a north pole 39, from which magnetic field lines 40 arise, and a south pole 41, in which the magnetic field lines 40 end. FIGS. 9 to 11 serve as a schematic representation of the first stationary armature magnet 27 and the first sensor magnet 23 which can be moved in relation to the stationary armature magnet 27 with a schematic representation of their poles 39, 41 and the magnetic field lines 40 of the magnets 23 to 26 and 27 to 30 in the remote-control system 1. The following explanations are based on the first sensor magnet 23 and the first armature magnet 27 referring to all magnets 23 to 26 and 27 to 30 in the remote-control system 1.

The armature magnet 27 and the sensor magnet 23 are arranged homopolarly to each other in the remote-control system 1. This means that, when viewed in the pressure application direction, two equal poles 39, 41 are directed towards each other. In this way, a neutral zone 42 is created between the two magnets 23, 27, in which no or only an imperceptible magnetic field exists.

If the measuring sensor 35 were held centrically between the armature magnet 27 and the sensor magnet 23, the magnetic field lines 40 received by the measuring sensor 35 would continuously decrease, and the corresponding pushbutton position signal 43 emitted by the measuring sensor 35 would drop continuously when the corresponding first pushbutton 8 was pressed in the pressure application direction 18, and when the sensor magnet 23 thus moved towards the armature magnet 27. Basically, this could already be used to detect the position of the pushbuttons 8 to 11. However, the decrease in the magnetic field lines 40 in this constellation is so low that the sensitivity which can be achieved technically by the measuring sensor 35 would not be sufficient to detect the pressure of the pushbutton of the corresponding pushbutton 8 over various position states.

Figure 12:
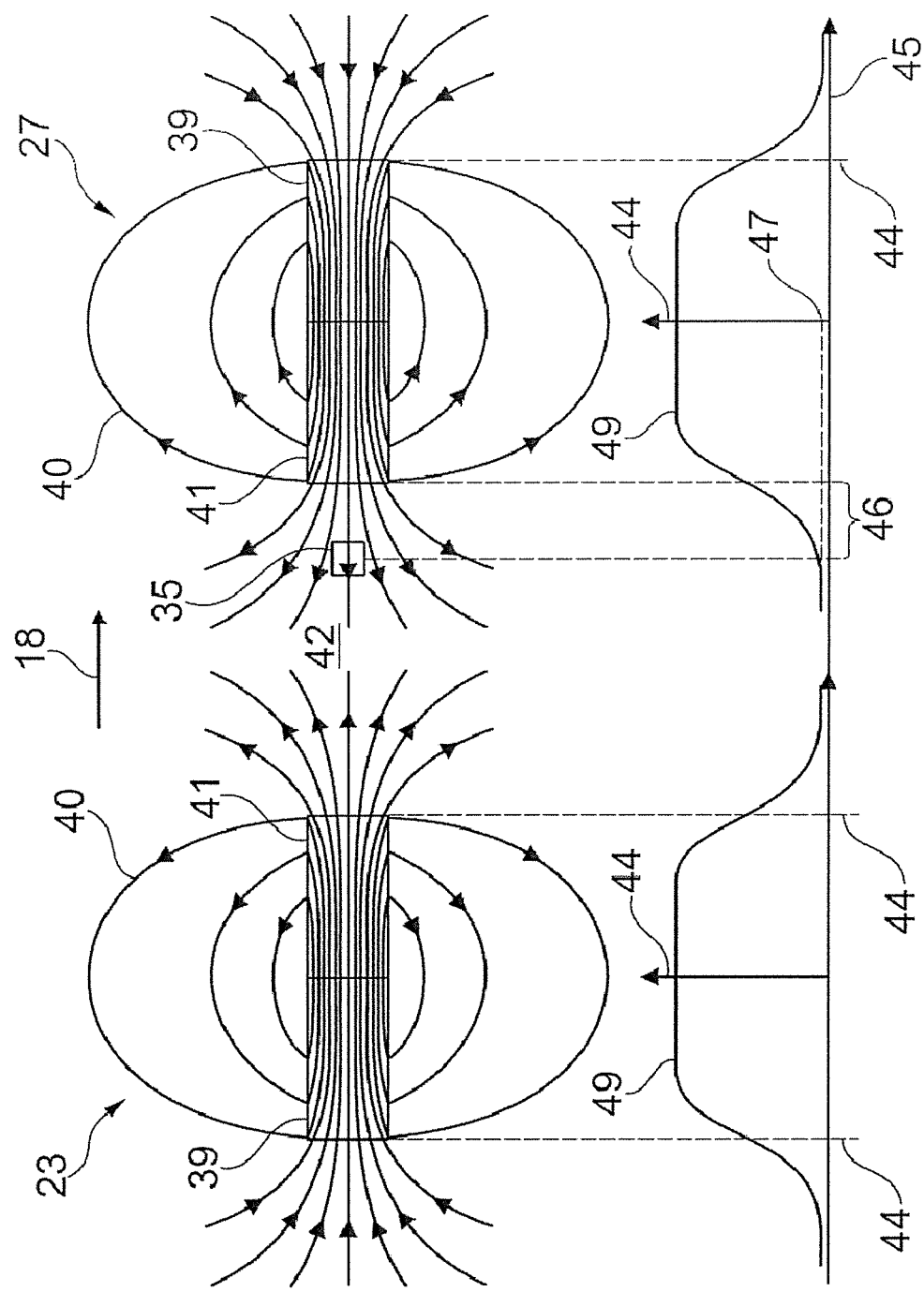
FIG. 12 a diagram showing the behaviour of a magnetic field around the sensor magnet and the armature magnet.

For this purpose, FIG. 12 shall be discussed briefly, showing the course of the amount 44 of the magnetic field of the first armature magnet 27 and the first sensor magnet 23 over the position of the pressure of the pushbutton 45 in the pressure application direction 18. The course of the amount 44 is derived from the ratios in an elongated and current-carrying coil, and is a qualitative representation.

The measuring sensor 35, which is held centrically between the armature magnet 27 and the sensor magnet 23, is fixed at a distance 46 to the armature magnet 27. At this distance 46, the measuring sensor 35 detects a certain initial value 47 as an amount 44 of the magnetic field. As the arrangement of the measuring sensor 35 shown in FIG. 12 causes the magnetic field of the armature magnet 27 in the neutral zone 42 to be weakened when the sensor magnet 23 moves towards the armature magnet 27, the amount 44 of the magnetic field, starting from the initial value 47, must decrease. This decrease is asymptotical with a corresponding low sensitivity of the measuring sensor 35.

To increase the sensitivity of the measuring sensor 35, it is not held centrically between the two magnets 23, 27 but at an eccentric distance 48 to the two magnets 23, 27, as shown in FIGS. 9 to 11.

At this eccentric distance 48, the closer the two magnets are arranged to each other, the stronger is the bundling of the magnetic field lines 40. This means that, starting from the initial value 47 shown in FIG. 12, the amount 44 of the magnetic field strength does not decrease but increases, and thus moves towards a maximum 49. The maximum 49 is reached when the limiting case shown in FIG. 10 occurs, that the magnetic field lines 40 are bundled symmetrically in the measuring sensor 35. If the sensor magnet 23 exceeds this pushbutton position 45, the amount 44 of the magnetic field strength drops again. However, the full increase of the amount 44 of the magnetic field strength between the initial value 47 and the maximum 49 may be utilized, and a correspondingly high sensitivity may be achieved with the measuring sensor 35.

If the measuring sensor 35 is offset relative to the sensor magnet 23 and the armature magnet 27 with the eccentric distance 48, it will be removed from the neutral zone 42. In this arrangement, the armature magnet 27 serves as supporting magnet which transfers the measuring sensor 35 to an operating point with an initial value 47, starting from which the changes in the magnetic field may be detected with a high sensitivity with any movement of the sensor magnet 23. In this way, even intermediate positions of the respective pushbutton 8 may be detected reliably from the pushbutton position signal 43 emitted from the measuring sensor 35. At the same time, both magnets 23, 27 repel each other, causing a reliable reset of the pushbutton 8 to an initial position.

The invention claimed is:

1. Remote-control system comprising:
   a pushbutton that can be pressed by a user to input information in that the user applies a pressure in a direction;
   a sensor magnet arranged on the underside of the pushbutton, when viewed in the pressure application direction;
   an armature magnet arranged below the pushbutton when viewed in the pressure application direction, and fixed relative to the pushbutton, wherein the magnetic poles of the sensor magnet and of the armature magnet are arranged in such a way that the pushbutton is pressed by the sensor magnet away from the armature magnet and against the pressure application direction; and
   a measuring sensor arranged when viewed in the pressure application direction between the sensor magnet and the armature magnet to output a pushbutton position signal which depends on a magnetic sensor field energized by the sensor magnet, and a magnetic armature field energized by the armature magnet;
   wherein the measuring sensor is held on a circuit board which is arranged in front of the armature magnet when viewed in the pressure application direction; and
   wherein the circuit board is provided with an immersion opening, into which the sensor magnet can be immersed when the pushbutton is pressed.

2. Remote-control system as claimed in claim 1, wherein the measuring sensor, when viewed in the pressure application direction, is arranged at a distance from the armature magnet and fixed there.

3. Remote-control system as claimed in claim 1, wherein the measuring sensor, when viewed in the pressure application direction, is arranged angularly at a distance from the armature magnet and fixed there.

4. Remote-control system as claimed in claim 1, wherein the measuring sensor is held on a side of the circuit board pointing to the armature magnet.

5. Remote-control system as claimed in claim 1, wherein in an initial position of the sensor magnet, the measuring sensor is arranged at a smaller distance to the armature magnet than to the sensor magnet.

6. Remote-control system as claimed in claim 1, comprising a housing with a guiding element to guide the pushbutton in the pressure application direction.

7. Remote-control system as claimed in claim 6, comprising a limiting element to restrict a movement of the pushbutton in the guiding element against the pressure application direction.

8. Remote-control system as claimed in claim 7, wherein the limiting element is a spigot which protrudes from the underside of the pushbutton when viewed in the pressure application direction angularly from the pushbutton.

9. Remote-control system as claimed in claim 8, wherein the spigot is guided in the guiding element.

10. Remote-control system as claimed in claim 8, wherein the circuit board comprises a recess, into which the spigot can be immersed in the pressure application direction.

11. Remote-control system as claimed in claim 1, wherein the pushbutton is part of a switch to which the sensor magnet is attached eccentrically to a centre axis, and wherein, starting from the centre axis opposite the sensor magnet, another sensor magnet is attached to the switch.

12. Remote-control system as claimed in claim 11, wherein the armature magnet is aligned in a line with the sensor magnet when viewed in the pressure application direction, and wherein another armature magnet is fixed on the housing which is located in a line with the further sensor magnet, when viewed in the pressure application direction.

13. Remote-control system as claimed in claim 1, comprising:
   the measuring sensor arranged when viewed in the pressure application direction between the sensor magnet and the armature magnet to output a pushbutton position signal which depends on a magnetic sensor field energized by the sensor magnet, and a magnetic armature field energized by the armature magnet;
   wherein the measuring sensor, when viewed in the pressure application direction, is arranged at a distance from the armature magnet and fixed there,
   wherein the measuring sensor is held on a circuit board which is arranged in front of the armature magnet when viewed in the pressure application direction; and
   wherein the measuring sensor is held on a side of the circuit board pointing to the armature magnet.

14. Remote-control system as claimed in claim 1 comprising:
a housing with a guiding element to guide the pushbutton in the pressure application direction;
a spigot limiting element to restrict a movement of the pushbutton in the guiding element against the pressure application direction, wherein the spigot protrudes from the underside of the pushbutton when viewed in the pressure application direction angularly from the pushbutton; and
wherein the spigot is guided in the guiding element.

15. Remote-control system comprising:
a pushbutton that can be pressed by a user to input information in that the user applies a pressure in a direction;
a sensor magnet arranged on the underside of the pushbutton, when viewed in the pressure application direction;
an armature magnet arranged below the pushbutton when viewed in the pressure application direction, and fixed relative to the pushbutton, wherein the magnetic poles of the sensor magnet and of the armature magnet are arranged in such a way that the pushbutton is pressed by the sensor magnet away from the armature magnet and against the pressure application direction; and
a measuring sensor arranged when viewed in the pressure application direction between the sensor magnet and the armature magnet to output a pushbutton position signal which depends on a magnetic sensor field energized by the sensor magnet, and a magnetic armature field energized by the armature magnet;
wherein the measuring sensor, when viewed in the pressure application direction, is arranged at a distance from the armature magnet and fixed there;
wherein the measuring sensor is held on a circuit board which is arranged in front of the armature magnet when viewed in the pressure application direction;
wherein the measuring sensor is held on a side of the circuit board pointing to the armature magnet;
wherein the circuit board is provided with an immersion opening, into which the sensor magnet can be immersed when the pushbutton is pressed; and
wherein the measuring sensor is arranged in an initial position of the sensor magnet at a smaller distance to the armature magnet than to the sensor magnet.

16. Remote-control system comprising:
a pushbutton that can be pressed by a user to input information in that the user applies a pressure in a direction;
a sensor magnet arranged on the underside of the pushbutton, when viewed in the pressure application direction;
an armature magnet arranged below the pushbutton when viewed in the pressure application direction, and fixed relative to the pushbutton, wherein the magnetic poles of the sensor magnet and of the armature magnet are arranged in such a way that the pushbutton is pressed by the sensor magnet away from the armature magnet and against the pressure application direction;
a housing with a guiding element to guide the pushbutton in the pressure application direction; and
a spigot limiting element to restrict a movement of the pushbutton in the guiding element against the pressure application direction, wherein the spigot protrudes from the underside of the pushbutton when viewed in the pressure application direction angularly from the pushbutton;
wherein the spigot is guided in the guiding element;
wherein the circuit board comprises a recess, into which the spigot can be immersed in the pressure application direction; and
wherein the pushbutton is part of a switch to which the sensor magnet is attached eccentrically to a centre axis, and wherein, starting from the centre axis opposite the sensor magnet, another sensor magnet is attached to the switch.

* * * * *